United States Patent
Seol et al.

(10) Patent No.: US 11,822,492 B2
(45) Date of Patent: Nov. 21, 2023

(54) SIGNAL ENCODING METHOD AND A SEMICONDUCTOR DEVICE TO GENERATE AN OPTIMAL TRANSITION CODE IN A MULTI-LEVEL SIGNALING SYSTEM

(71) Applicant: SAMSUNG ELECTRONICS CO., LTD., Suwon-si (KR)

(72) Inventors: Chang Kyu Seol, Osan-si (KR); Byung-Suk Woo, Hwaseong-si (KR); Su Cheol Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 36 days.

(21) Appl. No.: 17/551,781

(22) Filed: Dec. 15, 2021

(65) Prior Publication Data
US 2022/0327067 A1 Oct. 13, 2022

(30) Foreign Application Priority Data
Apr. 9, 2021 (KR) .......................... 10-2021-0046464

(51) Int. Cl.
*G06F 7/02* (2006.01)
*G06F 13/16* (2006.01)
*H04L 1/00* (2006.01)
*G11C 7/10* (2006.01)

(52) U.S. Cl.
CPC ........ *G06F 13/1668* (2013.01); *G11C 7/1009* (2013.01); *H04L 1/0047* (2013.01)

(58) Field of Classification Search
CPC .. G06F 13/1668; G11C 7/1009; H04L 1/0047
See application file for complete search history.

(56) References Cited

U.S. PATENT DOCUMENTS

| | | | | |
|---|---|---|---|---|
| 3,753,113 A * | 8/1973 | Maruta | ............... | H04L 25/4919 341/94 |
| 5,280,500 A * | 1/1994 | Mazzola | ................. | H03M 5/20 341/76 |
| 6,377,640 B2 * | 4/2002 | Trans | .................... | H04L 1/0047 375/354 |
| 6,487,244 B1 * | 11/2002 | Betts | ................... | H04L 27/3427 375/222 |
| 7,081,838 B2 * | 7/2006 | Hoyer | ................. | H04L 25/4908 341/59 |
| 7,176,721 B2 * | 2/2007 | Ho | ...................... | H04L 25/4906 326/82 |
| 7,844,888 B2 * | 11/2010 | Nygren | ............... | G11C 11/4096 714/805 |
| 8,015,478 B2 * | 9/2011 | Miller | ................. | H03M 13/096 714/758 |
| 8,407,558 B2 * | 3/2013 | Abbasfar | ............ | G06F 11/1004 714/755 |
| 8,510,490 B2 * | 8/2013 | Abbasfar | ............ | G06F 13/4265 341/55 |

(Continued)

*Primary Examiner* — Cheng Yuan Tseng
(74) *Attorney, Agent, or Firm* — F. Chau & Associates, LLC

(57) ABSTRACT

A signal processing method of a semiconductor device, the method including: receiving a first digital code of a first digital signal; generating a constraint vector; masking the first digital code with a transmitting mask based on the constraint vector; and outputting the masked first digital code and a Data Bus Inversion (DBI) bit of the mask.

19 Claims, 10 Drawing Sheets

(56) References Cited

U.S. PATENT DOCUMENTS

| | | | |
|---|---|---|---|
| 8,706,958 B2* | 4/2014 | Hein | G11C 5/148 |
| | | | 711/104 |
| 8,854,236 B2* | 10/2014 | Hollis | H03M 5/02 |
| | | | 341/56 |
| 9,142,269 B2 | 9/2015 | Hein | |
| 9,252,997 B1* | 2/2016 | Mishra | H04L 27/06 |
| 9,405,721 B2* | 8/2016 | Ayyapureddi | G06F 13/4221 |
| 9,509,535 B2 | 11/2016 | Hollis | |
| 10,277,441 B2* | 4/2019 | Hollis | H04L 27/04 |
| 10,365,833 B2 | 7/2019 | Hollis et al. | |
| 10,404,505 B1* | 9/2019 | Wilson | H03K 5/24 |
| 10,491,238 B2 | 11/2019 | Sudhakaran et al. | |
| 10,623,200 B2* | 4/2020 | Wilson | G06F 13/4027 |
| 10,692,555 B2* | 6/2020 | Oh | G11C 11/4076 |
| 10,832,768 B2* | 11/2020 | Schreck | G06F 3/0616 |
| 10,860,417 B1* | 12/2020 | Spirkl | G11C 7/10 |
| 11,159,153 B2* | 10/2021 | Lee | H04B 14/023 |
| 11,170,868 B2* | 11/2021 | Ryu | G11C 7/1057 |
| 11,216,333 B2* | 1/2022 | Schaefer | H04L 1/0041 |
| 11,218,343 B2* | 1/2022 | Park | H04L 25/14 |
| 11,249,837 B2* | 2/2022 | Das Sharma | G06F 11/076 |
| 11,348,623 B2* | 5/2022 | Cho | G11C 7/1072 |
| 11,392,299 B2* | 7/2022 | Johnson | G06F 3/0671 |
| 11,449,274 B2* | 9/2022 | Woo | G06F 3/0679 |
| 11,539,377 B2* | 12/2022 | Woo | G11C 7/1006 |
| 11,594,267 B2* | 2/2023 | Lee | G11C 7/222 |
| 2014/0016404 A1* | 1/2014 | Kim | G11C 11/165 |
| | | | 365/158 |
| 2016/0352419 A1* | 12/2016 | Fonseka | H04L 1/0052 |
| 2019/0305765 A1 | 10/2019 | Lee et al. | |
| 2020/0242062 A1 | 7/2020 | Lee et al. | |
| 2020/0341838 A1* | 10/2020 | Hollis | G06F 11/1008 |
| 2022/0083244 A1* | 3/2022 | Um | G11C 7/1084 |
| 2022/0294554 A1* | 9/2022 | Seol | H04L 1/0057 |

* cited by examiner

| | Previously Encoded Data | | Current Data | | |
|---|---|---|---|---|---|
| | LSBp | MSBp | LSB0 | CV* | MSB0 |
| DQ0 | 0 | 0 | 0 | 0 | 1 |
| DQ1 | 0 | 1 | 0 | 0 | 1 |
| DQ2 | 1 | 0 | 0 | 1 | 0 |
| DQ3 | 0 | 0 | 1 | 1 | 0 |

FIG. 7

Mask Book

| Pattern Index | M0 | M1 | M2 | M3 |
|---|---|---|---|---|
| DBI bit | 00 | 01 | 10 | 11 |
| DQ0 | 0 | 0 | 1 | 1 |
| DQ1 | 0 | 1 | 0 | 1 |
| DQ2 | 0 | 0 | 1 | 1 |
| DQ3 | 0 | 1 | 0 | 1 |

FIG. 8

| | MSB0 ^ M0 & CV | MSB0 ^ M1 & CV | MSB0 ^ M2 & CV | MSB0 ^ M3 & CV |
|---|---|---|---|---|
| DQ0 | 0 | 0 | 0 | 0 |
| DQ1 | 0 | 0 | 0 | 0 |
| DQ2 | 0 | 0 | 1 | 1 |
| DQ3 | 0 | 1 | 0 | 1 |
| MT Count | 0 | 1 | 1 | 2 |

Mask Book 1

| Pattern Index | M0 | M1 | M2 | M3 |
|---|---|---|---|---|
| DBI bit | 00 | 01 | 10 | 11 |
| DQ0 | 0 | 0 | 1 | 1 |
| DQ1 | 0 | 1 | 0 | 1 |
| DQ2 | 0 | 0 | 1 | 1 |
| DQ3 | 0 | 1 | 0 | 1 |

FIG. 12b

Mask Book 2

| Pattern Index | M0 | M1 | M2 | M3 |
|---|---|---|---|---|
| DBI bit | 00 | 01 | 10 | 11 |
| DQ0 | 0 | 0 | 1 | 1 |
| DQ1 | 0 | 0 | 1 | 1 |
| DQ2 | 0 | 1 | 0 | 1 |
| DQ3 | 0 | 1 | 0 | 1 |

FIG. 13

| | Previously Encoded Data | | Current Data | | |
|---|---|---|---|---|---|
| | LSBp | MSBp | LSB0 | CV* | MSB0 |
| DQ0 | 0 | 0 | 0 | 0 | 1 |
| DQ1 | 0 | 1 | 0 | 0 | 1 |
| DQ2 | 1 | 0 | 0 | 1 | 0 |
| DQ3 | 0 | 0 | 1 | 1 | 1 |

FIG. 14

|  | MSB0 ^ M0 & CV | MSB0 ^ M1 & CV | MSB0 ^ M2 & CV | MSB0 ^ M3 & CV |
|---|---|---|---|---|
| DQ0 | 0 | 0 | 0 | 0 |
| DQ1 | 0 | 0 | 0 | 0 |
| DQ2 | 0 | 0 | 1 | 1 |
| DQ3 | 1 | 0 | 1 | 0 |
| MT Count | 1 | 0 | 2 | 1 |

FIG. 15

|  | Previously Encoded Data | | Current Encoded Data | |
|---|---|---|---|---|
|  | LSBp | MSBp | LSB0 | MSB0 ^ M2 |
| DQ0 | 0 | 0 | 0 | 0 |
| DQ1 | 0 | 1 | 0 | 0 |
| DQ2 | 1 | 0 | 0 | 1 |
| DQ3 | 0 | 0 | 1 | 1 |
| DBI | X | X | 1 | 0 |

FIG. 16

|  | MSB0 ^ M0 & CV | MSB0 ^ M1 & CV | MSB0 ^ M2 & CV | MSB0 ^ M3 & CV |
|---|---|---|---|---|
| DQ0 | 0 | 0 | 0 | 0 |
| DQ1 | 0 | 0 | 0 | 0 |
| DQ2 | 0 | 1 | 0 | 1 |
| DQ3 | 1 | 0 | 1 | 0 |
| MT Count | 1 | 1 | 1 | 1 |

FIG. 17

|  | Previously Encoded Data | | Current Encoded Data | |
|---|---|---|---|---|
|  | LSBp | MSBp | LSB0 | MSB0 ^ M1 |
| DQ0 | 0 | 0 | 0 | 0 |
| DQ1 | 0 | 1 | 0 | 0 |
| DQ2 | 1 | 0 | 0 | 0 |
| DQ3 | 0 | 0 | 1 | 1 |
| DBI | X | X | 0 | 0 |

SIGNAL ENCODING METHOD AND A SEMICONDUCTOR DEVICE TO GENERATE AN OPTIMAL TRANSITION CODE IN A MULTI-LEVEL SIGNALING SYSTEM

CROSS-REFERENCE TO RELATED APPLICATION

This application claims priority under 35 U.S.C. § 119 to Korean Patent Application No. 10-2021-0046464, filed Apr. 9, 2021, the disclosure of which is incorporated by reference herein in its entirety.

1. TECHNICAL FIELD

The present inventive concept relates to a signal processing method and device for generating an optimal transition code in an environment that transmits and receives data signals at a multi-level.

2. DESCRIPTION OF THE RELATED ART

Data transmission and data reception is the transfer and reception of data over a point-to-point or point-to-multipoint communication channel. In data transmission and reception between a host and a memory device, when a pulse amplitude modulation 2-level technique is employed, an amount of data that may be transmitted at one time is small. Accordingly, a multi-level signal transmission technique may be used to increase a communication bandwidth between different kinds of devices.

SUMMARY

Embodiments of the present inventive concept provide a signal processing method and a semiconductor device in which a maximum transition does not occur in a multi-level signaling system.

Embodiments of the present inventive concept also provide a signal processing method and a semiconductor device in which an eye margin is secured, while minimizing latency.

An embodiment of the inventive concept provides a signal processing method of a semiconductor device, the method including: receiving a first digital code of a first digital signal; generating a constraint vector; masking the first digital code with a transmitting mask based on the constraint vector; and outputting the masked first digital code and a Data Bus Inversion (DBI) bit of the mask.

An embodiment of the inventive concept provides a semiconductor device including: a processing unit which outputs a first digital code; an encoder which masks the first digital code with a transmitting mask based on a constraint vector; and a transmitting circuit which transmits the masked first digital code and a DBI bit of the transmitting mask, wherein the constraint vector is based on a second digital code which is a previous digital code with respect to the first digital code.

An embodiment of the inventive concept provides a semiconductor device, including: a receiving circuit which receives a first digital code and a DBI bit; and a decoder which unmasks the first digital code with a receiving mask based on the DBI bit, wherein the receiving mask corresponds to a constraint vector generated on the basis of a second digital code which is a previous digital code with respect to the first digital code.

BRIEF DESCRIPTION OF THE DRAWINGS

FIG. 7 is a diagram showing a mask book according to some embodiments of the inventive concept.

FIG. 8 is a diagram for explaining a signal processing method according to some embodiments of the inventive concept.

FIG. 11 is a diagram specifically showing another embodiment of the decoder shown in FIG. 1.

FIGS. 12a and 12b show a plurality of mask books applied to some embodiments of the inventive concept.

FIG. 13 is a diagram for explaining a signal processing method according to some embodiments of the inventive concept.

FIG. 14 is a diagram for explaining a signal processing method according to some embodiments of the inventive concept.

FIG. 15 is a diagram for explaining a signal processing method according to some embodiments of the inventive concept.

FIG. 16 is a diagram for explaining a signal processing method according to some embodiments of the inventive concept.

FIG. 17 is a diagram for explaining a signal processing method according to some embodiments of the inventive concept.

DETAILED DESCRIPTION OF THE EMBODIMENTS

Hereinafter, embodiments of the present inventive concept will be described referring to the accompanying drawings.

Figure 1:
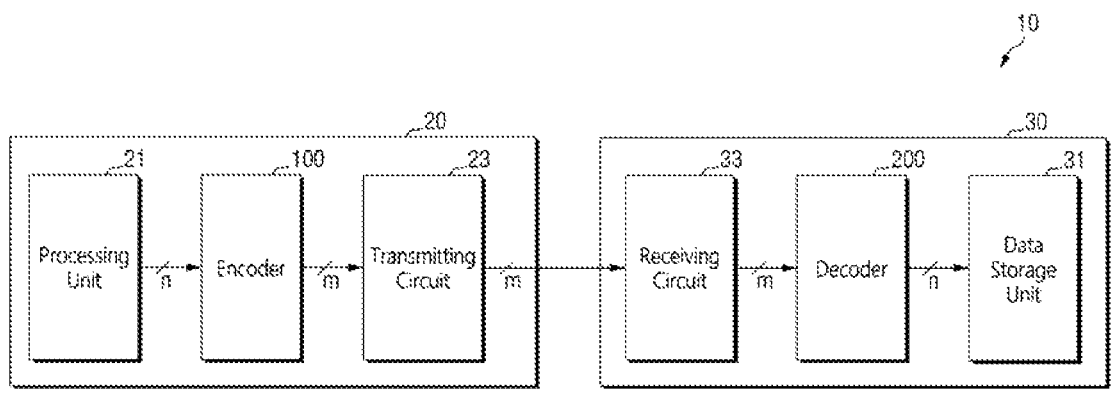
FIG. 1 shows a semiconductor device that operates in a signal processing method according to some embodiments of the inventive concept.
Figure 2:
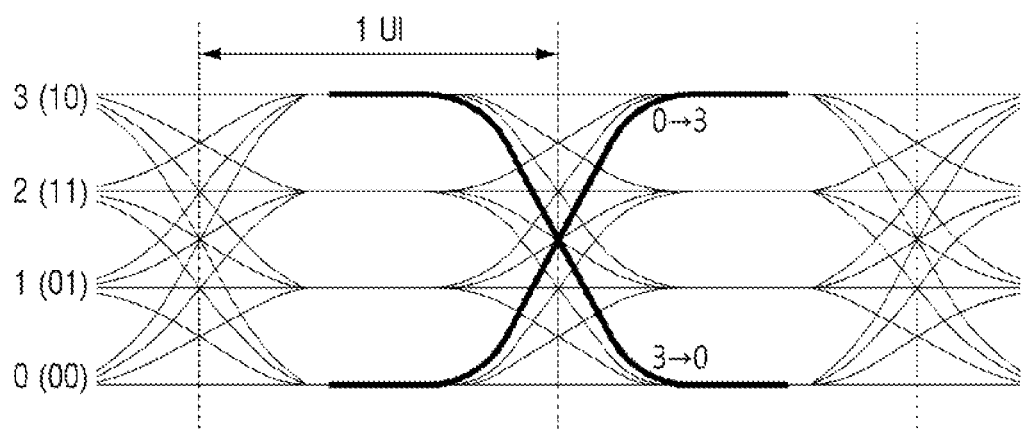
FIG. 2 is a signal diagram showing signals transmitted and received through a data bus.

FIG. 1 shows a semiconductor device that operates in a signal processing method according to some embodiments of the inventive concept. FIG. 2 is a signal diagram showing signals transmitted and received through a data bus.

A semiconductor device 10 includes a transmitting device 20 and a receiving device 30. The transmitting device 20 performs data encoding that is symmetrical to the receiving device 30 on data to be transmitted, and the receiving device 30 may perform data decoding that is symmetrical to the transmitting device 20 on data to be received. The semiconductor device 10 may encode or decode a digital signal with a multi-level signaling system to perform data communication. According to some embodiments of the inventive concept, the semiconductor device 10 may encode or decode the digital signal using pulse amplitude modulation. According to some embodiments of the inventive concept, the semiconductor device 10 may map the plurality of amplitude levels to a gray coding type binary code and perform encoding or decoding. A pulse amplitude modulation (PAM) may be 4 levels (e.g., PAM 4, 2 bit code), 8 levels (e.g., PAM 8, 3 bit code), 16 levels (e.g., PAM 16, 4 bit code) and the like, depending on the bit number of the digital code. As an example, the signal transmitted and received by the transmitting device 20 and the receiving device 30 may be a signal encoded using pulse amplitude modulation gray coding. An example shown in FIG. 2 shows the PAM 4 type transmission and reception signals according to Table 1.

TABLE 1

| PAM4 Symbol | LSB | MSB | Voltage |
| --- | --- | --- | --- |
| 0 | 0 | 0 | 0 mV |
| 1 | 0 | 1 | 200 mV |
| 2 | 1 | 1 | 400 mV |
| 3 | 1 | 0 | 600 mV |

According to some embodiments of the inventive concept, the transmitting device 20 and the receiving device 30 may be included in each of a first device and a second device connected by a wired network. For example, the first device may include a first semiconductor device 10, and the second device may include a second semiconductor device 10'. The first semiconductor device 10 may include a first transmitting device 20 and a first receiving device 30, and the second semiconductor device 10' may include a second transmitting device 20' and a second receiving device 30'.

For example, when the first device transmits first data to the second device, the first transmitting device 20 of the first semiconductor device 10 transmits the first data to the second receiving device 30' of the second semiconductor device 10'. In contrast, when the second device transmits second data to the first device, the second transmitting device 20' of the second semiconductor device 10' transmits the second data to the first receiving device 30 of the first semiconductor device 10.

The transmitting device 20 may include a processing unit 21, an encoder 100, and a transmitting circuit 23.

The processing unit 21 generates transmission data which is main data. The transmission data may be a digital signal of n-bit. The encoder 100 may perform encoding by mapping the transmission data of n-bit to a plurality of multi-level signals and converting the encoded data into a digital code of m-bit. The transmitting circuit 23 may output an analog signal having an amplitude level mapped to the digital code of m-bit to the receiving circuit 33. For example, when the digital code is 10, an analog signal having an amplitude level of 600 mV may be output. According to various embodiments of the inventive concept, n and m may be the same natural number or may be natural numbers that are different from each other.

For example, as shown in FIG. 2, when using a pulse amplitude modulation type of four or more levels, in the case of a signal with a wide range of transition, for example, a signal that changes from a maximum voltage level 3 to a minimum voltage level 0, or in contrast, a signal that changes from the minimum voltage level 0 to the maximum voltage level 3, power for signal transmission is increased, and a cross talk may occur in an adjacent data bus. Further, an eye margin due to a slope of the voltage level transition may be insufficient. Therefore, a signal processing technique that has a minimum delay, while reducing the probability that a maximum transition occurs, can be employed to reduce crosstalk and secure an eye margin.

The encoder 100 may mask a raw digital signal with a transmitting digital code by using a transmitting mask based on a constraint vector according to some embodiments of the inventive concept. The constraint vector may be, for example, a signal which compares a digital code to be currently transmitted (hereinafter, 'current digital code') with a previously transmitted digital code (hereinafter, 'previous digital code') and indicates a position at which an occurrence probability of the maximum transition is high at the current digital code (hereinafter, an occurrence position of the maximum transition code).

According to some embodiments of the inventive concept, the encoder 100 includes a plurality of transmitting masks. There may be a plurality of transmitting masks corresponding to the bit number of the digital code. For example, when the digital code is 2 bits in PAM4, there may be four transmitting masks. For example, when the digital code is 3 bits in PAM8, there may be eight transmitting masks.

According to some embodiments of the inventive concept, the encoder 100 may include a plurality of mask books. The plurality of transmitting masks may be grouped and stored as a single mask book. In other words, the single mask book may include the plurality of transmitting masks of predetermined patterns.

For example, when the encoder 100 includes a first mask book and a second mask book, a plurality of transmitting mask patterns included in the first mask book may be different from a plurality of transmitting mask patterns included in the second mask book.

According to some embodiments of the inventive concept, the encoder 100 may select any one transmitting mask having the minimum bit counts, in the constraint vector generated by masking each of the plurality of transmitting masks to the current digital code. The bit count may be the number of the occurrence position of the maximum transition code in the current digital code.

In addition, according to some embodiments of the inventive concept, the encoder 100 may select any one mask book which minimizes the number of maximum transition codes in the plurality of mask books, and may select any one transmitting mask which minimizes the number of maximum transition codes in the selected mask book.

The encoder 100 masks the current digital code with the selected transmitting mask and outputs the masked current digital code to the transmitting circuit 23. On the other hand, the encoder 100 maps the mask information of the mask used for masking to a Data Bus Inversion (DBI) bit and outputs the DBI bit to the transmitting circuit 23. The transmitting circuit 23 may transmit the masked digital code (e.g., m bits) of the main data and the DBI bit of the mask information to the receiving device 30.

The receiving device 30 receives the masked digital code and the DBI bit.

The receiving device 30 may select a receiving mask corresponding to the DBI bit. The receiving device 30 may include a plurality of receiving masks that are the same as the transmitting mask of the transmitting device 20. The receiving device 30 may restore the constraint vector on the basis of the previous digital code, and select any one receiving mask corresponding to the DBI bit and the constraint vector among the plurality of receiving masks. The receiving device 30 may unmask the masked digital code on the basis of the selected receiving mask.

The receiving device 30 includes a receiving circuit 33, a decoder 200, and a data storage unit 31. The receiving circuit 33 may receive an analog signal having an amplitude level mapped to a digital code of m-bit from the transmitting circuit 23. The decoder 200 may perform decoding to unmask the digital code of m-bit and converting the unmasked digital code of m-bit into a digital code of n-bit. The data storage unit 31 may store the decoded digital code. According to various embodiments of the inventive concept, n and m may be the same natural number or may be natural numbers that are different from each other.

Figure 3:
FIGS. 3 and 4 are diagrams for explaining a signal processing method according to some embodiments of the inventive concept.
Figure 4:
Figure 4:
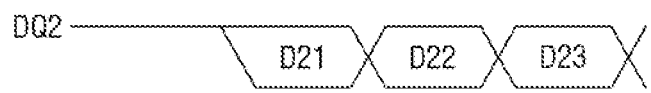
Figure 4:
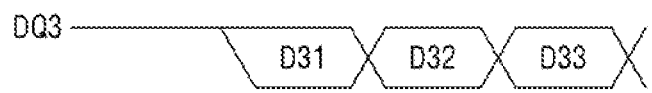
Figure 4:
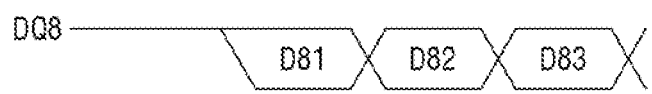
Figure 4:
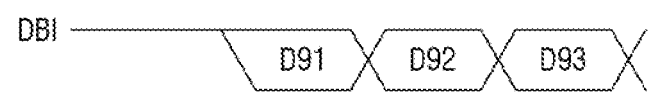

FIGS. 3 and 4 are diagrams for explaining a signal processing method according to some embodiments of the inventive concept.

Referring to FIGS. 3 and 4, the transmitting device 20 transmits data to the receiving device 30 in the form of a burst. In the burst type output, for example, the main data may be output in parallel along with the DBI bit of the DBI bus through a 8-pin data bus, DQ[7:0]. For example, a first burst of FIG. 4 (D11, D21, and D31 to D81) and the DBI bit (D91) are output at a time point T1 of FIG. 3, and a second burst of FIG. 4 (D12, D22, and D32 to D82) and DBI (D92) bit may be output at a time point T2 of FIG. 3. A third burst of FIG. 4 (D13, D23, and D33 to D83) and DBI (D93) bit may be output at a time point T3 of FIG. 3.

For convenience of explanation, in the case of PAM 4 Gray coding, a description will be provided on the assumption that the data output to the single pin is a 2-bit data signal that is mapped to the four level amplitude.

The transmitting device 20 continuously transmits the data burst from the time point T1 to the time point T8 through the data bus DQ[7:0] to the DBI pin. For example, to explain based on a T1 digital code and a T2 digital code, the transmitting device 20 simultaneously outputs the T1 digital code (a) at the time point T1 through DQ[7:0] to the DBI pin, and stores the T1 digital code (a). The transmitting device 20 compares the digital code transmitted at the time point T2 with the stored T1 digital code, checks the occurrence position of the maximum transition, masks the digital code to be transmitted to a mask that minimizes the occurrence of the maximum transition, and outputs to the mask that minimizes the occurrence of the maximum transition as the T2 digital code (3). At this time, the mask information is transmitted through the DBI pin so that the mask used for transmission may be checked by the receiving device 30. Accordingly, when decoding the current digital code in the receiving device 30, since it is only necessary to check the immediately previous digital code (e.g., T1 digital code in the above example), only one unit unit interval (UI) (referring to FIG. 2, 1 UI) may be taken in the decoding latency.

Figures 5, 6:
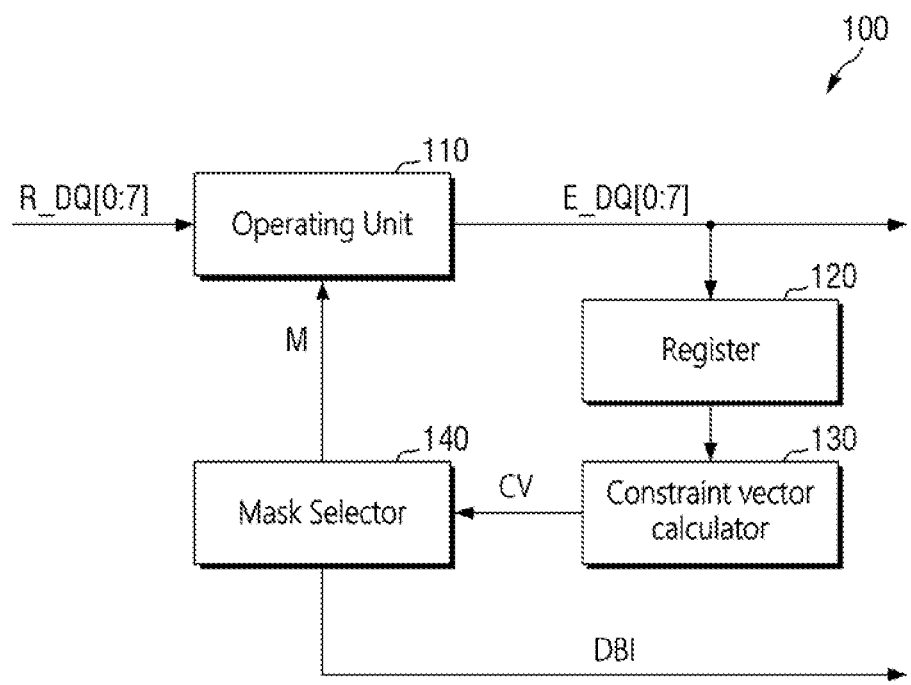
FIG. 5 is a diagram specifically showing an embodiment of the encoder shown in FIG. 1.
FIG. 6 is a diagram for explaining a signal processing method according to some embodiments of the inventive concept.
Figure 9:
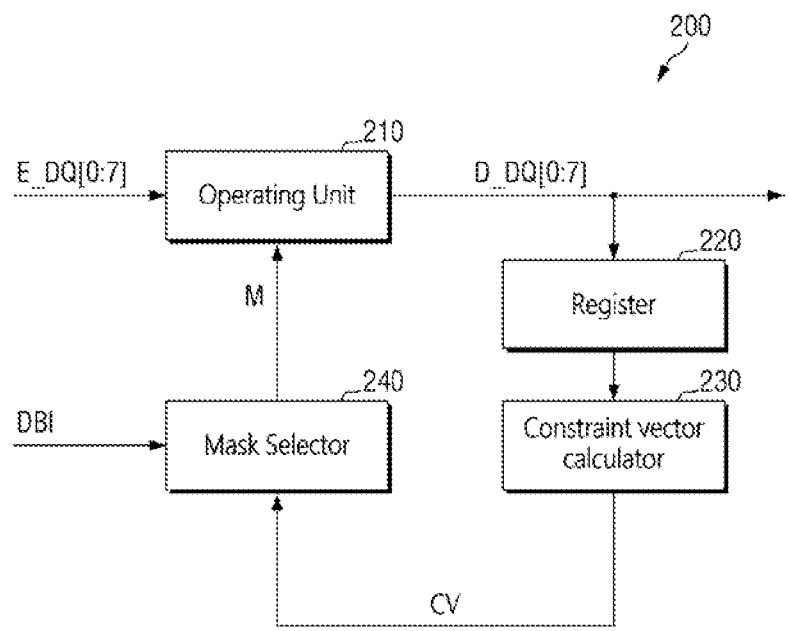
FIG. 9 is a diagram specifically showing an embodiment of the decoder shown in FIG. 1.

FIG. 5 is a diagram specifically showing an embodiment of the encoder shown in FIG. 1. FIG. 6 is a diagram for explaining a signal processing method according to some embodiments of the inventive concept. FIG. 7 is a diagram showing a mask book according to some embodiments of the inventive concept. FIG. 8 is a diagram for explaining a signal processing method according to some embodiments of the inventive concept. FIG. 9 is a diagram specifically showing an embodiment of the decoder shown in FIG. 1.

Referring to FIG. 5, the encoder 100 may include an operating unit 110, a register 120, a constraint vector calculator 130 and a mask selector 140.

The operating unit 110 masks a current digital code R_DQ (corresponding to Binary User Data) output from the processing unit 21 to a selected transmitting mask M and outputs the masked current digital code R_DQ as a masked current digital code E_DQ. The operating unit 110 may, for example, perform an XOR operation of the current digital code R_DQ and the transmitting mask M, and the masked current digital code E_DQ may be a result value of the XOR operation.

The register 120 stores the masked digital code E_DQ. The register 120 stores a previous digital code (e.g., a time point $T_{k-1}$) used for masking the current digital code (e.g., a time point Tk). For example, in the example of FIG. 3, the T1 digital code is stored to generate a T2 digital code.

The constraint vector calculator 130 generates a constraint vector on the basis of the previous digital code stored in the register 120. The constraint vector may be, for example, a signal that indicates a position at which the occurrence probability of the maximum transition is high at the current digital code (hereinafter, an occurrence position of the maximum transition code), by comparing the digital code to be currently transmitted (hereinafter, 'current digital code') with the previously transmitted digital code (hereinafter, 'previous digital code').

Referring to FIG. 6, in the PAM 4 type, the signals that can be transmitted to one pin may be 10, 11, 01, and 00 as shown in FIG. 2. In this case, the maximum transition may occur when the signal changes from 10 to 00 or from 00 to 10 in a given single pin. In other words, the maximum transition may occur when changing from the maximum voltage level 3 to the minimum voltage level 0, and vice versa.

The items shown in FIG. 6 are shown in the order of output from each pin, in other words, in the order of LSB and MSB. For example, the output is output in the order of LSB 0 and MSB 1 at the pin of DQ 1, but the actual data needs to be considered as '10'. The following description will be given in the order output.

The constraint vector calculator 130 may be generated by comparing the previous digital code (Previously Encoded Data) with the current digital code (Current Data). When considering the LSB and MSB in the shown example, since the data pin DQ0 changes from 00 (previous) to 01 (current), and the data pin DQ1 changes from 01 (previous) to 01 (current), this does not correspond to the maximum transition, and in this case, the constraint vector CV may be calculated as 0.

However, in the data pin DQ2, when the LSB of the next digital code becomes 0 in the previous digital code 10, the next digital code may become 00 or 10 depending on the MSB. Accordingly, the constraint vector CV may be set to 1. In the data pin DQ3, when the LSB of the next digital code becomes 1 in the previous digital code 00, the next digital code may become 10 or 11 depending on the MSB. Accordingly, the constraint vector may be set to 1.

In other words, when receiving the LSB of the previous digital code (Previously data) to the next digital code (Current data) input to the same data pin of the continuous UI, the maximum transition may or may not occur, depending on which value of the MSB is input (in the example of FIG. 6, in the case of 00→1X and 10→0X of DQ2 and DQ3).

Therefore, the constraint vector calculator 130 may set the constraint vector CV on the basis of the LSB of the previous digital code and the next digital code. The constraint vector may be set to 1 when the maximum transition is likely to occur and may be set to 0 when the maximum transition is unlikely to occur, when calculated on the basis of the LSB of the next digital code.

For example, the constraint vector may be calculated by the following formula 1 in PAM4 type gray coding.

$$CV = (LSBp \wedge LSB0) \& (\sim MSBp) \quad (1)$$

In formula, 1, CV is a constraint vector, LSBp is a least significant bit of the previous digital code, MSBp is a most significant bit of the previous digital code, LSB0 is a least significant bit of the current digital code, '^' is an XOR operation, '&' is an AND operation, and '~' means a NOT operation.

The mask selector 140 may store a plurality of masks, select any one mask on the basis of the constraint vector CV, and output the selected mask M to the operating unit 110. The plurality of masks may be a sequence having a mask pattern according to the bit number of the digital code.

Referring to FIGS. 6 and 7, according to some embodiments of the inventive concept, when the data burst is DQ[0:3], the mask selector 140 is assumed to include the predetermined four masks M0, M1, M2 and M3. A mask M0 may have a sequence of 0000, a mask M1 may have a sequence of 0101, a mask M2 may have a sequence of 1010, and a mask M3 may have a sequence of 1111.

The mask selector 140 may output mask information to the transmitting circuit 23 through the DBI pin. The DBI bit information transmitted as mask information may be a code value that represents each of the plurality of masks. The DBI bit information corresponds to the number of masks according to various embodiments of the inventive concept, and the bit numbers representing each mask may vary As an example, if there are four masks, two bits may be represented. In the shown example, the DBI bits may be represented as 00 for the mask M0, 01 for the mask M1, 10 for the mask M2, and 11 for the mask M3. Alternatively, as another example, when there are eight masks, 3 bits may be represented.

The mask selector 140 may select the mask in which the sum of the bit counts (MT Count) calculated corresponding to the constraint vector CV and the current digital code DQ[0:3] is the minimum, among the plurality of transmitting masks. In other words, the expression that the sum of the bit counts (MT Count) is the minimum may mean that the erased number of maximum transitions is the maximum, and the mask selector 140 may select the optimal transmitting mask in which the largest number of maximum transitions may be erased.

Referring to FIGS. 6, 7 and 8, the mask selector 140 masks the current digital code DQ[0:3] and calculates the bit count to which the constraint vector is applied. In other words, the bit count MT Count may be calculated according to formula 2.

$$MT\ Count = bit1count((MSB0 \wedge M) \& CV) \quad (2).$$

In formula 2, MT Count is a bit count, MSB0 is a most significant bit of the current digital code, M is a mask, CV is a constraint vector, '^' is an XOR operation, '&' is an AND operation, is a NOT operation, and bit1count ( ) is a function that calculates and outputs the number of 1 in the binary vector input to the element in ( ).

The mask selector 140 calculates the value (MT count) added up by calculating the bit counts of each data pin DQ of the same UI, 0 for the mask M0, 1 for the mask M1, 1 for the mask M2, and 2 for the mask M3. In this case, the mask M3 having the maximum value may be selected and transmitted to the operating unit 110, and the code value 11 may be output to the DBI pin.

Further, the operating unit 110 converts MSB0 of the current digital code as in formula 2 and outputs the converted MSB0 as a masked value. In other words, DQ2 00 and DQ3 01 of FIG. 6 are masked, converted and output into DQ2 10 and DQ3 11 as in FIG. 8. As a result, since the current digital code 10 is output in the previous digital code 01 in DQ2, and 11 is output in the previous digital code 00 in DQ3, the maximum transition may not occur in DQ[0:4].

Referring to FIG. 9, the decoder 200 may include an operating unit 210, a register 220, a constraint vector calculator 230, and a mask selector 240.

The operating unit 210 unmasks the masked digital code E_DQ from the receiving circuit 33 to the selected receiving mask M and outputs it as the unmasked current digital code D_DQ.

The register 220 stores the unmasked digital code D_DQ. The register 220 stores the previous digital code to unmask the current digital code. For example, in the example of FIG. 3, the decoded digital code T1 is stored to decode the T2 digital code.

The constraint vector calculator 230 generates a constraint vector CV on the basis of the previous digital code stored in the register 220. The constraint vector CV may be calculated and restored in the same manner as the encoder 100.

The mask selector 240 may store a plurality of receiving masks, select any one receiving mask on the basis of the constraint vector CV, and output the selected receiving mask M to the operating unit 210. The plurality of receiving masks may be a sequence having the same mask pattern as the plurality of transmitting masks of the transmitting device 20. The mask selector 240 may select any one receiving mask among the plurality of receiving masks on the basis of the DBI bit received through the DBI pin, and output the selected receiving mask M to the operating unit 210.

Figure 10:
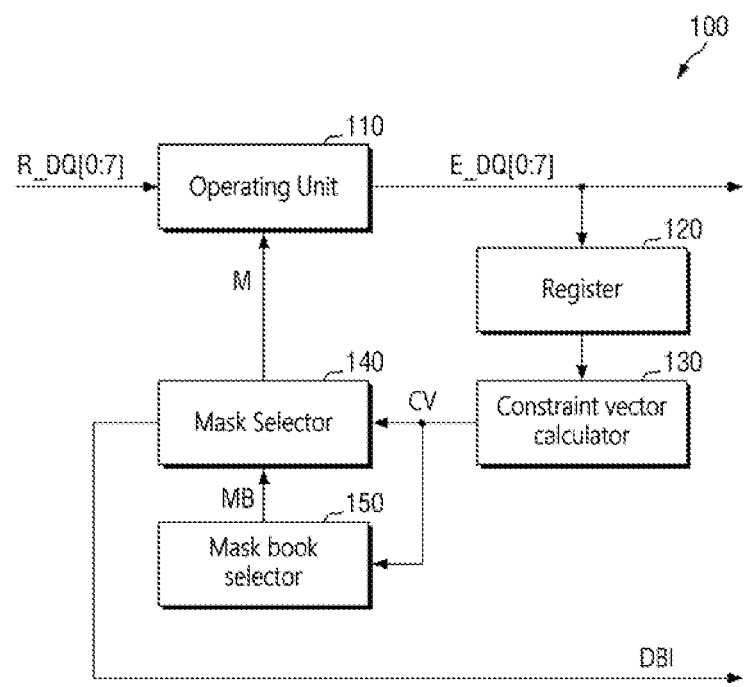
FIG. 10 is a diagram specifically showing another embodiment of the encoder shown in FIG. 1.
Figures 11, 12A:
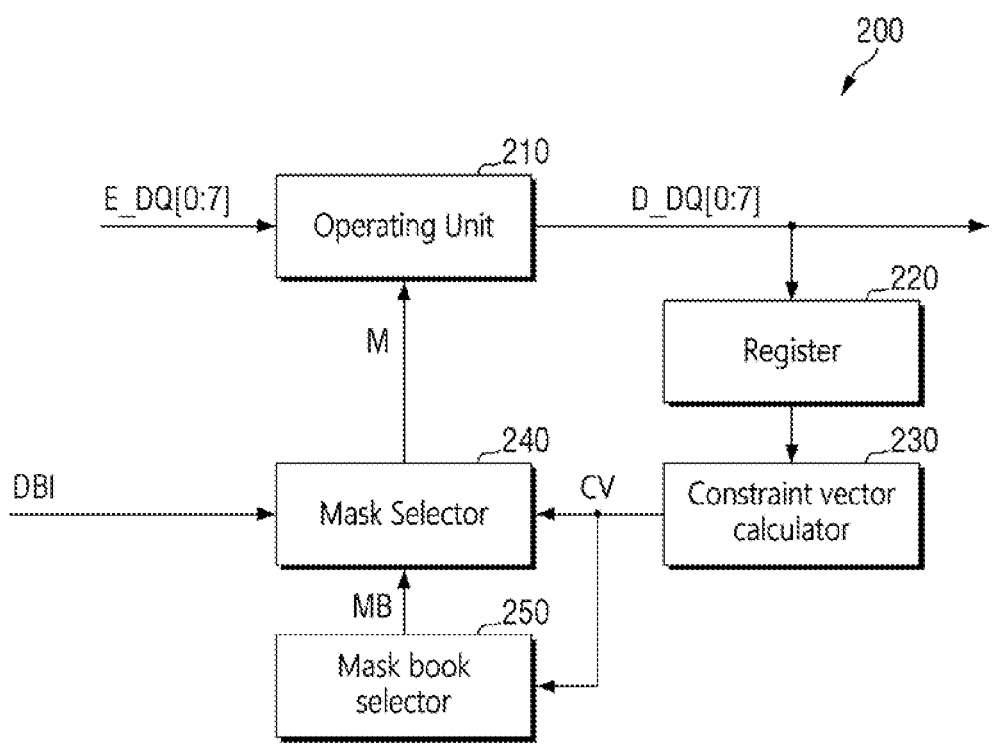

FIG. 10 is a diagram specifically showing another embodiment of the encoder shown in FIG. 1. FIG. 11 is a diagram specifically showing another embodiment of the decoder shown in FIG. 1.

Referring to FIGS. 10 and 11, the encoder 100 may further include a transmitting mask book selector 150. Further, the decoder 200 may further include a receiving mask book selector 250 to correspond to the transmitting mask book selector 150.

The transmitting mask book selector 150 may include a plurality of transmitting mask books. The receiving mask book selector 250 may include a plurality of receiving mask books. The plurality of transmitting mask books and the plurality of receiving mask books may symmetrically include the plurality of masks, each corresponding to the DBI bit.

By including a plurality of mask books including a plurality of masks, the semiconductor device 10 may secure more mask sequences that minimize the occurrence probability of the maximum transition.

The operation of mask book will be described below in FIGS. 12 to 17.

FIGS. 12a and 12b show a plurality of mask books according to some embodiments of the inventive concept. FIG. 13 is a diagram for explaining a signal processing method according to some embodiments of the inventive concept. FIG. 14 is a diagram for explaining a signal processing method according to some embodiments of the inventive concept. FIG. 15 is a diagram for explaining a signal processing method according to some embodiments of the inventive concept. FIG. 16 is a diagram for explaining a signal processing method according to some embodiments of the inventive concept. FIG. 17 is a diagram for explaining a signal processing method according to some embodiments of the inventive concept.

Referring to FIGS. 12a and 12b, the transmitting mask book selector 150 and the receiving mask book selector 250 include two mask books (Mask Book1 and Mask Book2).

According to some embodiments of the inventive concept, first, the mask book selectors 150 and 250 may select the mask book on the basis of the constraint vector CV. The mask selectors 140 and 240 may select any one mask M corresponding to the constraint vector CV in the mask book MB selected by the mask book selectors 150 and 250.

When there are a plurality of mask books, the mask book selectors 150 and 250 may select any one mask book according to a pattern in which the constraint vector CV is 1. The shown mask book (Mask Book1) of FIG. 12a has a sequence of a pattern different from that of the mask book (Mask Book2) of FIG. 12b. For example, the mask patterns of masks M1 and M2 may be different from each other. The mask M1 of the mask book (Mask Book1) converts the MSB of the odd-numbered pins DQ1 and DQ3 of the current digital code, and the mask M2 of the mask book (Mask Book1) converts the MSB of the even-numbered pins DQ0 and DQ2 of the current digital code. The mask M1 of the mask book (Mask Book2) converts the MSB of the upper pins DQ2 and DQ3 of the current digital code, and mask M2 of the mask book (Mask Book2) converts the MSB of the lower pins DQ0 and DQ1 of the current digital code.

Specifically, the mask book selectors 150 and 250 may select the mask book according to the position of the constraint vector 1 (the position where CV is 1 in all the data pins). For example, if the position where the constraint vector is 1 has a pattern shown alternately for each pin (in other words, an odd-numbered pin or an even-numbered pin), the mask book (Mask Book1) of FIG. 12a may be selected. For example, if the position where the calculated constraint vector is 1 has another pattern, the mask book (Mask Book2) of FIG. 12b may be selected. After that, the mask selectors 140 and 150 may select any one mask among a plurality of masks on the basis of the constraint vector from the mask book selected by the mask book selectors 150 and 250.

For example, suppose the previous digital code and the current digital code are transmitted as in FIG. 13. In this case, the data pins DQ2 and DQ3 correspond to the case of 10→0X and 00→1X, and the constraint vector CV may be calculated as 1 on the basis of formula 1.

As shown in FIGS. 14 and 15, when using the mask book (Mask Book1), in MSB0 of the current digital code, when using mask M1, since DQ2 is subsequently transmitted from 10 to 01, and DQ3 is subsequently transmitted from 00 to 11, all the occurrence positions of the maximum transition may be removed (MT Count=0).

However, as shown in FIGS. 16 and 17, when using the mask book (Mask Book 2), in MSB0 of the current digital code, even when using any mask (e.g., Mask M1), since DQ2 is subsequently transmitted from 10 to 00, and DQ3 is subsequently transmitted from 00 to 11, a maximum transition occurs in DQ2, and all the occurrence positions of maximum transition may not be erased (MT Count=1).

The mask selectors 140 and 240 select the mask in which the sum of the bit counts is the maximum in the selected mask book.

Figure 18:
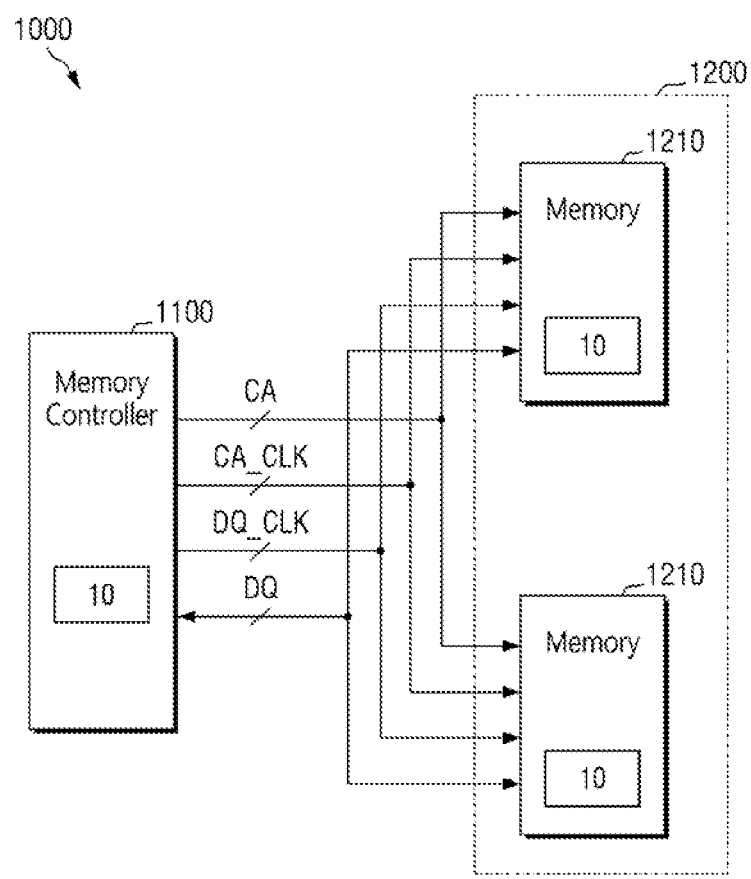
FIG. 18 is a diagram showing a memory system including the semiconductor device of FIG. 1.

FIG. 18 is a diagram showing a memory system including the semiconductor device of FIG. 1.

The semiconductor device 10 may be included in the memory system 1000. Specifically, the memory system 1000 may include a memory controller 1100 and a plurality of memory devices 1200.

The memory controller 1100 controls the operation of the memory system 1000, and controls the overall exchange of data between a host and the memory device 1210. For example, the memory controller 1100 may control the memory device 1210 to write or read data in response to requests from the host. For example, the memory controller 1100 applies operating commands for controlling the memory device 1210 to control the operation of the memory devices 1210.

According to various embodiments of the inventive concept, each of the memory devices 1210 may be one of a Phase change Random Access Memory (PRAM), a Resistive Random Access Memory (RRAM), a Magnetic Random Access Memory (MRAM), and a Ferroelectric Random Access Memory (FRAM) including resistive memory cells. In another embodiment of the inventive concept, each of the memory devices 1210 may be a dynamic random access memory (DRAM) including dynamic memory cells.

The memory controller 1100 may transmit commands and addresses to and from each of the plurality of memory devices 1200 in accordance with a clock through a CA bus, and a CA_CLK bus. The memory controller 1100 may transmit data bursts and DBI bits to each of the plurality of memory devices 1200 in accordance with a data clock through a DQ CLK bus and a DQ bus.

The memory controller 1100 may include a semiconductor device 10 including both the transmitting device 20 and the receiving device 30 as a first device. Each of the plurality of memory devices 1200 (or 1210) may include a semiconductor device 10 including both the transmitting device 20 and the receiving device 30 as a second device.

It is to be understood that those skilled in the art will appreciate that many variations and modifications may be made to the embodiments described herein without departing from the principles of the present inventive concept. Therefore, the present inventive concept is not limited to the embodiments described herein.

What is claimed is:

1. A signal processing method of a semiconductor device, the method comprising:
receiving, at an encoder of the semiconductor device, a first digital code of a first digital signal;
generating, at the encoder, a constraint vector, wherein the constraint vector is a signal based on comparing at least one least significant bit (LSB) of the first digital code with a second digital code, which is a previous digital code with respect to the first digital code, to indicate a position where a maximum transition code is able to occur in the first digital code;
masking, at the encoder, the first digital code with a transmitting mask based on the constraint vector; and
outputting, from the encoder, the masked first digital code and a Data Bus Inversion (DBI) bit of the mask.

2. The signal processing method of claim 1, wherein the first digital code is based on gray coding of a pulse amplitude modulation of four or more levels.

3. The signal processing method of claim 1, wherein the transmitting mask includes a plurality of transmitting masks corresponding to a bit number of the first digital code.

4. The signal processing method of claim 3, wherein the transmitting mask that masks the first digital code is a mask in which the sum of bit counts calculated corresponding to the constraint vector and the first digital code is the maximum, among the plurality of transmitting masks.

5. The signal processing method of claim 4, wherein the bit count is the number of positions where the maximum transition code is able to occur in the first digital code.

6. The signal processing method of claim 3, wherein the DBI bit is a digital code corresponding to each of the plurality of masks.

7. The signal processing method of claim 1, wherein the transmitting mask includes a plurality of transmitting mask books, each transmitting mask book including a plurality of transmitting masks corresponding to a bit number of the first digital code.

8. The signal processing method of claim 1, wherein a receiving semiconductor device that communicates with a transmitting semiconductor device receives the masked first digital code and the DBI bit;
  selects a receiving mask corresponding to the DBI bit; and
  unmasks the masked first digital code with the selected receiving mask.

9. The signal processing method of claim 8, wherein the receiving mask is selected among a plurality of receiving masks, on the basis of the DBI bit and another constraint vector generated from a second digital code which is a previous digital code with respect to the first digital code.

10. A semiconductor device, comprising:
  a processing unit which outputs a first digital code;
  an encoder which masks the first digital code with a transmitting mask based on a constraint vector, wherein the constraint vector is signal based on comparing at least one least significant bit (LSB) of the first digital code with the second digital code to indicate a position where a maximum transition code is able to occur in the first digital code; and
  a transmitting circuit which transmits the masked first digital code and a Data Bus Inversion (DBI) bit of the transmitting mask,
  wherein the constraint vector is based on a second digital code which is a previous digital code with respect to the first digital code.

11. The semiconductor device of claim 10, wherein the encoder comprises:
  a register which stores the second digital code;
  a constraint vector calculator which generates the constraint vector on the basis of the second digital code;
  a mask selector which stores a plurality of transmitting masks and outputs the transmitting mask corresponding to the constraint vector; and
  an operating unit which masks the first digital code with the transmitting mask output from the mask selector.

12. The semiconductor device of claim 11, wherein the DBI bit has a plurality of code values corresponding to each of the plurality of transmitting masks.

13. The semiconductor device of claim 11, further comprising:
  a mask book selector which stores a plurality of transmitting mask books and selects any one transmitting mask book corresponding to the constraint vector.

14. The semiconductor device of claim 13, wherein the plurality of mask books include the plurality of transmitting masks, and
  the mask book selector outputs any one transmitting mask from the transmitting mask book selected to correspond to the constraint vector.

15. The semiconductor device of claim 11, wherein the transmitting mask output by the mask selector is a mask in which the sum of bit counts calculated corresponding to the constraint vector and the first digital code is the maximum, among the plurality of transmitting masks.

16. The semiconductor device of claim 10, wherein the semiconductor device is included in each of a memory controller and a memory device.

17. A semiconductor device, comprising:
  a receiving circuit which receives a first digital code and a Data Bus Inversion (DBI) bit; and
  a decoder which unmasks the first digital code with a receiving mask based on the DBI bit,
  wherein the receiving mask corresponds to a constraint vector generated on the basis of a second digital code which is a previous digital code with respect to the first digital code,
  wherein the decoder includes:
  a receiving mask book selector which stores a plurality of receiving mask books and selects any one receiving mask book corresponding to the constraint vector,
  wherein a mask selector outputs the receiving mask corresponding to the DBI bit in the selected receiving mask book.

18. The semiconductor device of claim 17, wherein the decoder includes:
  a register which stores the second digital code;
  a constraint vector calculator which generates the constraint vector on the basis of the second digital code;
  the mask selector which stores a plurality of receiving masks and outputs the receiving mask corresponding to the DBI bit; and
  an operating unit which unmasks the first digital code with the receiving mask output from the mask selector.

19. The semiconductor device of claim 17, wherein the semiconductor device is included in each of a memory controller and a memory device.

* * * * *